United States Patent
Kazama et al.

(10) Patent No.: US 10,889,878 B2
(45) Date of Patent: Jan. 12, 2021

(54) ALLOY MATERIAL, CONTACT PROBE, AND CONNECTION TERMINAL

(71) Applicants: NHK Spring Co., Ltd., Yokohama (JP); YAMAKIN CO., LTD., Osaka (JP); Shinko Metal Products Co., Ltd., Kitakyushu (JP)

(72) Inventors: Toshio Kazama, Kanagawa (JP); Yoshihisa Tani, Nagano (JP); Satoshi Shoji, Nagano (JP); Teruo Anraku, Osaka (JP); Masayuki Ainoya, Kochi (JP); Tomohiro Kubota, Kochi (JP); Kotaro Toyotake, Fukuoka (JP); Hitoshi Abe, Fukuoka (JP)

(73) Assignees: NHK Spring Co., Ltd., Yokohama (JP); YAMAKIN CO., LTD., Osaka (JP)

(*) Notice: Subject to any disclaimer, the term of this patent is extended or adjusted under 35 U.S.C. 154(b) by 428 days.

(21) Appl. No.: 15/562,580

(22) PCT Filed: Mar. 31, 2016

(86) PCT No.: PCT/JP2016/060829
§ 371 (c)(1),
(2) Date: Sep. 28, 2017

(87) PCT Pub. No.: WO2016/159315
PCT Pub. Date: Oct. 6, 2016

(65) Prior Publication Data
US 2018/0105902 A1  Apr. 19, 2018

(30) Foreign Application Priority Data

Mar. 31, 2015 (JP) ................................. 2015-074330

(51) Int. Cl.
| | | |
|---|---|---|
| *C22C 30/02* | (2006.01) | |
| *C22C 5/04* | (2006.01) | |
| *C22F 1/14* | (2006.01) | |
| *H01R 13/03* | (2006.01) | |
| *C22F 1/00* | (2006.01) | |
| *G01R 1/067* | (2006.01) | |
| *H01B 1/02* | (2006.01) | |
| *H01R 12/70* | (2011.01) | |
| *H01R 13/24* | (2006.01) | |

(52) U.S. Cl.
CPC ................ *C22C 30/02* (2013.01); *C22C 5/04* (2013.01); *C22F 1/00* (2013.01); *C22F 1/14* (2013.01); *G01R 1/06755* (2013.01); *H01B 1/026* (2013.01); *H01R 13/03* (2013.01); *G01R 1/06722* (2013.01); *H01R 12/7076* (2013.01); *H01R 13/2421* (2013.01); *H01R 2201/20* (2013.01)

(58) Field of Classification Search
CPC . C22C 5/04; C22C 30/02; C22C 30/00; C22F 1/14; C22F 1/00
See application file for complete search history.

(56) References Cited

U.S. PATENT DOCUMENTS

| | | | |
|---|---|---|---|
| 2014/0377129 A1* | 12/2014 | Shishino | C22C 30/02 420/587 |
| 2015/0168455 A1 | 6/2015 | Anraku et al. | |
| 2015/0197834 A1 | 7/2015 | Kumita et al. | |

FOREIGN PATENT DOCUMENTS

| | | |
|---|---|---|
| JP | 2014-114465 A | 6/2014 |
| WO | 2013/099682 A1 | 7/2013 |
| WO | 2014/021465 A1 | 2/2014 |
| WO | 2014/049874 A1 | 4/2014 |

OTHER PUBLICATIONS

International Search Report dated Jun. 21, 2016, issued for PCT/JP2016/060829.

* cited by examiner

*Primary Examiner* — Jessee R Roe
(74) *Attorney, Agent, or Firm* — Locke Lord LLP

(57) ABSTRACT

An alloy material includes: a composition, in a composition range of a ternary alloy of silver (Ag), palladium (Pd), and copper (Cu), the composition containing 20 to 30 wt % of Ag, 35 to 55 wt % of Pd, and 20 to 40 wt % of Cu. The composition as a base is added with tin (Sn) in a range of 0.5 to 2.5 wt %, further added with any one of or a combination of cobalt (Co), chromium (Cr), and zinc (Zn) in a range of 0.1 to 1.0 wt %, and added with 0.01 to 0.1 wt % of either one of or a combination of iridium (Ir) and ruthenium (Ru).

19 Claims, 3 Drawing Sheets

ALLOY MATERIAL, CONTACT PROBE, AND CONNECTION TERMINAL

FIELD

The present invention relates to, for example, an alloy material and relates to a contact probe formed of the ally material for use in a continuity test or a performance test on a target object such as a semiconductor integrated circuit and a liquid crystal display and a connection terminal formed of the alloy material that connects electric contacts with each other.

BACKGROUND

Conventionally, when a continuity test or a performance test is performed on a target object such as a semiconductor integrated circuit and a liquid crystal panel, a conductive contact probe that electrically connects the target object and a signal processing apparatus having a circuit board that outputs a test signal has been used. To perform an accurate continuity test or an accurate performance test, it is desired that input and output of the test signal via the contact probe be performed without failure.

The contact probe is used while being repeatedly brought into contact with test objects such as semiconductor integrated circuits and liquid crystal displays. When the contact probe is oxidized through repeated use, test results are affected. Given these circumstances, it is necessary for a material for the contact probe to have high conductivity, corrosion resistance and favorable oxidation resistance. To lessen the abrasion of the contact probe itself even when contact with the target objects is performed through repeated tests, it is important to have high hardness characteristic that is hard to be abraded.

The inventors of the present invention have reported an alloy with silver (Ag), palladium (Pd), and copper (Cu) as main components in order to solve these problems (refer to Patent Literature 1).

CITATION LIST

Patent Literature

Patent Literature 1: WO 2014/021465

SUMMARY

Technical Problem

However, as semiconductor integrated circuits and liquid crystal displays become densified, precise working tends to be required for the contact probe for use in a test. Given these circumstances, the alloy reported in Patent Literature 1 is inferior in machinability, and desired shapes may not be obtained.

The present invention has been made in view of the foregoing, and an object thereof is to provide an alloy material that has improved conductivity, high hardness and improved rolling workability and machinability, and a contact probe and a connection terminal formed of the alloy material.

Solution to Problem

To solve the above-described problem and achieve the object, an alloy material according to the present invention includes: a composition, in a composition range of a ternary alloy of silver (Ag), palladium (Pd), and copper (Cu), the composition containing 20 to 30 wt % of Ag, 35 to 55 wt % of Pd, and 20 to 40 wt % of Cu, wherein the composition as a base is added with tin (Sn) in a range of 0.5 to 2.5 wt %, further added with any one of or a combination of cobalt (Co), chromium (Cr), and zinc (Zn) in a range of 0.1 to 1.0 wt %, and added with 0.01 to 0.1 wt % of either one of or a combination of iridium (Ir) and ruthenium (Ru).

Moreover, the alloy material according to the present invention is further added with 0.003 to 0.03 wt % of phosphorous (P).

Moreover, in the above-described alloy material according to the present invention, Vickers hardness subjected to aging treatment by heating is 480 to 560.

A conductive contact probe according to the present invention is a conductive contact probe, wherein both ends of the conductive contact probe in a longitudinal direction are configured to contact with respective contact objects, and at least a part of the conductive contact probe is formed of the alloy material according to the invention.

Moreover, the contact probe according to the present invention includes: a conductive first plunger, one end of the conductive first plunger being configured to contact with one of the contact objects; a conductive second plunger, one end of the conductive second plunger being configured to contact with another one of the contact objects; and a coil spring provided in between the first plunger and the second plunger to couple the first plunger and the second plunger in an expandable and contractible manner, and at least one of the first plunger, the second plunger and the coil spring is formed of the alloy material.

Moreover, a conductive connection terminal according to the present invention is a conductive connection terminal, wherein both ends of the conductive connection terminal in a longitudinal direction are configured to contact with respective contact objects, and at least a part of the conductive connection terminal is formed of the alloy material according to the invention.

Advantageous Effects of Invention

The present invention has a composition, in a composition range of a ternary alloy of Ag, Pd and Cu, containing 20 to 30 wt % of Ag, 35 to 55 wt % of Pd, and 20 to 40 wt % of Cu as a base, with Sn added in the range of 0.5 to 2.5 wt %, with any one of or a combination of Co, Cr, and Zn further added in the range of 0.1 to 1.0 wt %, and with 0.01 to 0.1 wt % of one of or a combination of Ir and Ru further added and thereby produces an effect of making it possible to obtain an alloy material having improved conductivity, high hardness and improved rolling workability and machinability for contact probe use and connection terminal use.

DESCRIPTION OF EMBODIMENTS

Figure 1:
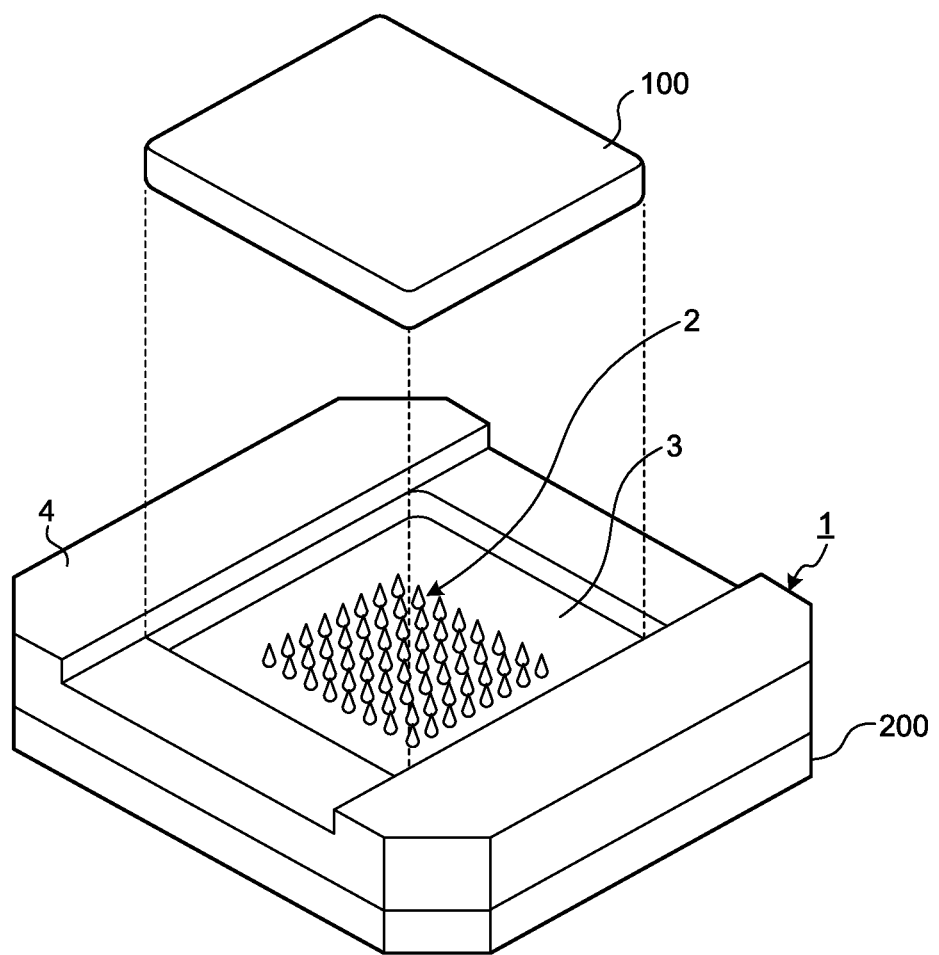
FIG. 1 is a perspective view of a schematic configuration of a socket according to one example use of an alloy material of an embodiment of the present invention.

The following describes an embodiment for performing the present invention in detail with accompanying drawings. The following embodiment does not limit the present invention. The drawings referred to in the following description only schematically illustrate shape, size, and positional relation to the extent that the details of the present invention can be understood. In other words, the present invention is not limited to only the shape, size, and positional relation exemplified in the drawings.

The following describes an alloy material according to the embodiment of the present invention. The alloy material according to the present embodiment contains a ternary alloy of silver (Ag)-palladium (Pd)-copper (Cu). The ternary alloy of Ag—Pd—Cu according to the present embodiment is an alloy formed within a region of 20 wt % Ag-40 wt % Pd-40 wt % Cu, 30 wt % Ag-35 wt % Pd-35 wt % Cu, 20 wt % Ag-55 wt % Pd-25 wt % Cu, and 30 wt % Ag-50 wt % Pd-20 wt % Cu. In other words, the ternary alloy of Ag—Pd—Cu according to the present embodiment is an alloy containing 20 to 30 wt % of Ag, 35 to 55 wt % of Pd, and 20 to 40 wt % of Cu. The alloy composition with such a weight ratio causes spinodal decomposition that causes two phases, or α2 (Ag) as a silver-rich phase and β of PdCu, to appear by aging treatment and is preferred in order to mix as few other appearance phases as possible. For these reasons, to satisfy improvement in hardness by the two appearance phases, the composition range of the ternary alloy of Ag—Pd—Cu is necessary to be limited.

Ag, Pd and Cu in the Ag—Pd—Cu alloy fuse with each other at a high temperature range, thereby forming a face-centered cubic (FCC) phase. In this process, Ag and Pd have property to fuse with each other both at the high temperature range and a low temperature range. Pd and Cu fuse with each other at the high temperature range and form the β phase as a compound phase at the low temperature range, thereby contributing to hardening; in this case, Vickers hardness is about 250 at most. Ag and Cu have property to separate into a copper-rich phase α1 (Cu) and α2 (Ag). In a specific composition range of this ternary alloy, various phases appear, leading to inability to obtain sufficient hardness in many cases.

When a composition of 25 wt % Ag-30 wt % Pd-45 wt % Cu is subjected to aging treatment, two phases, that is, α1 (Cu) and α2 (Ag), appear, for example. In a composition of 25 wt % Ag-60 wt % Pd-15 wt % Cu, three phases, that is, α2 (Ag), α2 (Pd) as a palladium-rich phase and β, appear. These appearance phases have influence on Vickers hardness, and when the appearance amount of α1 (Cu) and α2 (Pd) increases in particular, it is difficult to obtain improvement in Vickers hardness after aging treatment.

In a partial composition range in which the weight ratio of Pd is small, whereas the weight ratio of Cu is large, although α1 (Cu) appears, its appearance amount is minute, which does not have much influence on hardness. Further, to obtain improvement in Vickers hardness to the utmost, within the composition range of the ternary alloy of Ag—Pd—Cu of the alloy material according to the present embodiment, it is preferable to be within a region of 22 wt % Ag-43 wt % Pd-35 wt % Cu, 28 wt % Ag-40 wt % Pd-35 wt % Cu, 22 wt % Ag-50 wt % Pd-28 wt % Cu, and 28 wt % Ag-47 wt % Pd-25 wt % Cu.

To the alloy material according to the present embodiment, the composition within the composition range of the Ag—Pd—Cu ternary alloy being as a base, tin (Sn) is added in the range of 0.5 to 2.5 wt %, and any one of or a combination of cobalt (Co), chromium (Cr), and zinc (Zn) is further added in the range of 0.1 to 1.0 wt %. With this addition, Vickers hardness after aging treatment can be increased to 480 to 560.

To the alloy material with the composition, 0.01 to 0.1 wt % of either one of or a combination of iridium (Ir) and ruthenium (Ru) is further added, thereby obtaining an alloy material with a Vickers hardness of 480 to 560 and favorable in rolling workability.

The embodiment has a composition, in a composition range of a ternary alloy of Ag, Pd and Cu, containing 20 to 30 wt % of Ag, 35 to 55 wt % of Pd, and 20 to 40 wt % of Cu as a base, added with Sn in the range of 0.5 to 2.5 wt %, further added with any one of or a combination of Co, Cr, and Zn in the range of 0.1 to 1.0 wt %, and added with 0.01 to 0.1 wt % of either one of or a combination of Ir and Ru and can thereby obtain an alloy material having improved conductivity, high hardness and improved rolling workability and machinability for contact probe use.

To the alloy material with the composition, 0.003 to 0.03 wt % of P is further added, thereby expecting improvement in hardness.

According to the present embodiment, it has been found that, in the ternary alloy of Ag—Pd—Cu based on Ag, Pd and Cu, metals to be added to the ternary alloy for ensuring Vickers hardness and conductivity as a contact probe for semiconductor testing apparatus use.

In the ternary alloy of Ag—Pd—Cu, there is a difference in age hardening by a difference in phase transformation in the composition range; the alloy material according to the present embodiment achieves composition balance having the maximum hardening effect by the composition containing 20 to 30 wt % of Ag, 35 to 55 wt % of Pd, and 20 to 40 wt % of Cu in the composition range.

Pd and Cu form a compound phase to be hardened, in which even the maximum Vickers hardness is about 250 at most. When an appropriate amount of Ag is added thereto, α2 (Ag) and the β phase can be finely separated to the utmost by age hardening. Consequently, Vickers hardness can be increased.

The present embodiment contains a ternary alloy of Ag—Pd—Cu with weight ratios of 20 to 30 wt % of Ag, 35 to 55 wt % of Pd, and 20 to 40 wt % of Cu as a base, added with Sn in the range of 0.5 to 2.5 wt %, further added with any one of or a combination of Co, Cr, and Zn in the range of 0.1 to 1.0 wt %, and added with 0.01 to 0.1 wt % of either one of or a combination of Ir and Ru, thereby giving a Vickers hardness of an aged material subjected to aging treatment of 480 to 560, and thereby improving abrasion resistance as an alloy material to be suitable for the material of semiconductor testing apparatuses.

In the present embodiment, Ag and Cu have a tendency to decrease resistivity, whereas Pd has a tendency to increase resistivity and oxidation resistance. In other words, the alloy material according to the present embodiment achieves composition balance having conductivity and oxidation resistance while ensuring high hardness characteristics.

The ratios related to the alloy material of the present embodiment are, for satisfying high hardness, the ternary alloy of Ag—Pd—Cu within the region of 20 wt % Ag-40 wt % Pd-40 wt % Cu, 30 wt % Ag-35 wt % Pd-35 wt % Cu, 20 wt % Ag-55 wt % Pd-25 wt % Cu, and 30 wt % Ag-50 wt % Pd-20 wt % Cu as a base, added with Sn in the range of 0.5 to 2.5 wt %, further added with any one of or a combination of Co, Cr, and Zn in the range of 0.1 to 1.0 wt %, and added with 0.01 to 0.1 wt % of either one of or a combination of Ir and Ru, whereby Vickers hardness subjected to aging treatment reaches 480 to 560. When the addition is performed to a composition outside the region of this ternary alloy of Ag—Pd—Cu, it is difficult to improve hardness.

If the addition of Sn is less than 0.5 wt %, improvement in hardness is small. In contrast, if the addition of Sn exceeds 2.5 wt %, rolling workability degrades. Consequently, Sn is preferably added in the range of 0.5 to 2.5 wt %.

The alloy material according to the present embodiment may be added with any one of or a combination of Co, Cr, and Zn in the range of 0.1 to 1.0 wt %. These metals to be added are useful for machinability. If the amount of any one of or a combination of Co, Cr, and Zn to be added is less than 0.1 wt %, improvement in machinability is small. In contrast, if the amount exceeds 1.0 wt %, rolling workability degrades. Consequently, the amount is appropriately in the range of 0.1 to 1.0 wt %.

The alloy material according to the present embodiment may be further added with 0.01 to 0.1 wt % of either one of or a combination of Ir and Ru. These metals to be added are useful for workability and reduce minute cracks on the surface of the alloy during rolling to improve workability compared with an alloy material without those metals added. The amount of either one of or a combination of Ir and Ru to be added is appropriately 0.01 to 0.1 wt %, because even when the amount is 0.1 wt % or more, there is no change in the effect. This is because Ir and Ru have the effect of making crystal grains fine, and small crystal grains resist intergranular fracture during rolling.

The alloy material according to the present embodiment may be further added with 0.003 to 0.03 wt % of P. The addition of P is useful for improvement in hardness. If the amount of P to be added is less than 0.003 wt %, improvement in hardness is small. In contrast, if the amount exceeds 0.03 wt %, embrittlement occurs during solution treatment, and workability degrades. Consequently, the amount is appropriately in the range of 0.003 to 0.03 wt %.

Vickers hardness exhibits age hardening by subjecting a cast alloy material to solution treatment and heating the alloy material.

The alloy material according to the present embodiment can achieve lower material costs than alloys with platinum (Pt) and gold (Au) as main components.

The following describes a case when the alloy material according to the present embodiment is used as a contact probe. FIG. 1 is a perspective view of a schematic configuration of a socket (a contact probe) according to one example use of the alloy material of the embodiment of the present invention. A socket 1 illustrated in FIG. 1 is an apparatus used when testing electric characteristics of a semiconductor integrated circuit 100 as a target object and is an apparatus that electrically connects the semiconductor integrated circuit 100 and a circuit board 200 that outputs a test signal to the semiconductor integrated circuit 100.

The socket 1 includes: a plurality of contact probes 2 (hereinafter, referred to as simply "probes 2") one end in the longitudinal direction of which is to be in contact with one electrode (a contact object) of the semiconductor integrated circuit 100 as a contact body and the other end of which is to be in contact with an electrode (a contact object) of the circuit board 200; a probe holder 3 that houses the probes 2 in accordance with a predetermined pattern to hold them; and a holder 4 that is provided around the probe holder 3 to prevent the semiconductor integrated circuit 100 being in contact with the probes 2 from deviating during the test.

Figure 2:
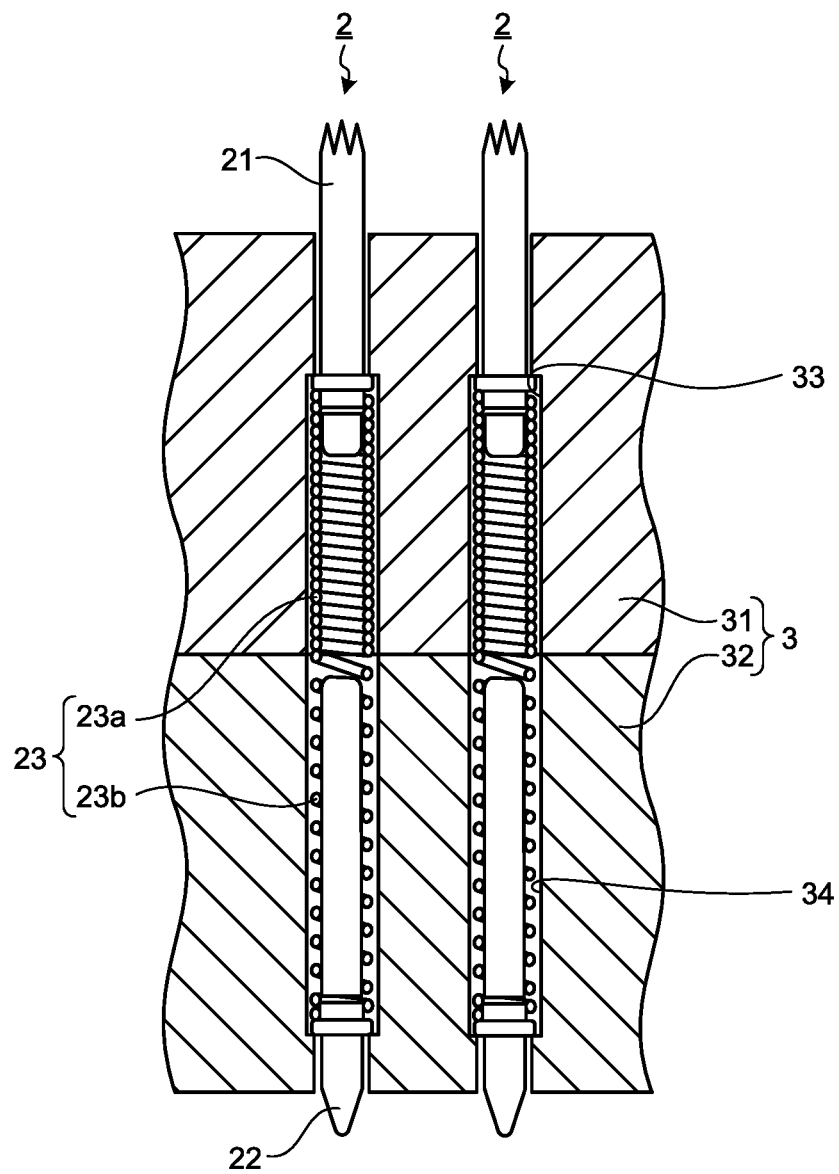
FIG. 2 is a partial sectional view of a configuration of a principal part of the socket according to the one example use of the alloy material of the embodiment of the present invention.

FIG. 2 is a partial sectional view of a configuration of a principal part of the socket (the contact probe) according to the one example use of the alloy material of the present embodiment and is a diagram of a detailed configuration of the probes 2 housed in the probe holder 3. The probes 2 illustrated in FIG. 2 each include: a first plunger 21 to be in contact with an electrode for connection of the semiconductor integrated circuit 100 when testing the semiconductor integrated circuit 100; a second plunger 22 to be in contact with an electrode 201 of the circuit board 200 including a testing circuit; and a coil spring 23 that is provided in between the first plunger 21 and the second plunger 22 to couple the first plunger 21 and the second plunger 22 in an expandable and contractible manner. The first plunger 21, the second plunger 22 and the coil spring 23 included in each of the probes 2 have the same axial line. The probes 2, when the semiconductor integrated circuit 100 is brought into contact therewith, relieve an impact on the electrode for connection of the semiconductor integrated circuit 100 and apply a load to the semiconductor integrated circuit 100 and the circuit board 200 through the expansion and contraction of the coil spring 23 in an axial line direction.

At least one of the first plunger 21, the second plunger 22 and the coil spring 23 is formed of the alloy material, all the members are preferably formed of this alloy material. As to the coil spring 23, the diameter of a wire rod and a wound diameter are designed so as to give spring characteristics in which the contraction amount of a coarsely wound part 23b when a predetermined load is applied is larger than the shortest distance between the base end of the second plunger 22 and a tightly wound part 23a in a state (refer to FIG. 1) in which the probes 2 are housed in the probe holder 3, for example, when an initial load is applied. By using the coil spring 23 having such spring characteristics, when the predetermined load is applied to the probes 2, a base end 22d is brought into sliding contact with the inside of the tightly wound part 23a, thereby enabling electric conduction between the base end 22d and the tightly wound part 23a.

The probe holder 3 is formed of an insulating material such as resin, machinable ceramics and silicon, in which a first member 31 positioned on the upper side of FIG. 2 and a second member 32 positioned on the lower side thereof are stacked. The first member 31 and the second member 32 are formed with the same number of holder holes 33 and 34, respectively, for housing the probes 2, and the holder holes 33 and 34 for housing the probes 2 are formed so as to cause their axial lines to be aligned with each other. The formation position of the holder holes 33 and 34 are determined in accordance with the wiring pattern of the semiconductor integrated circuit 100.

Figure 3:
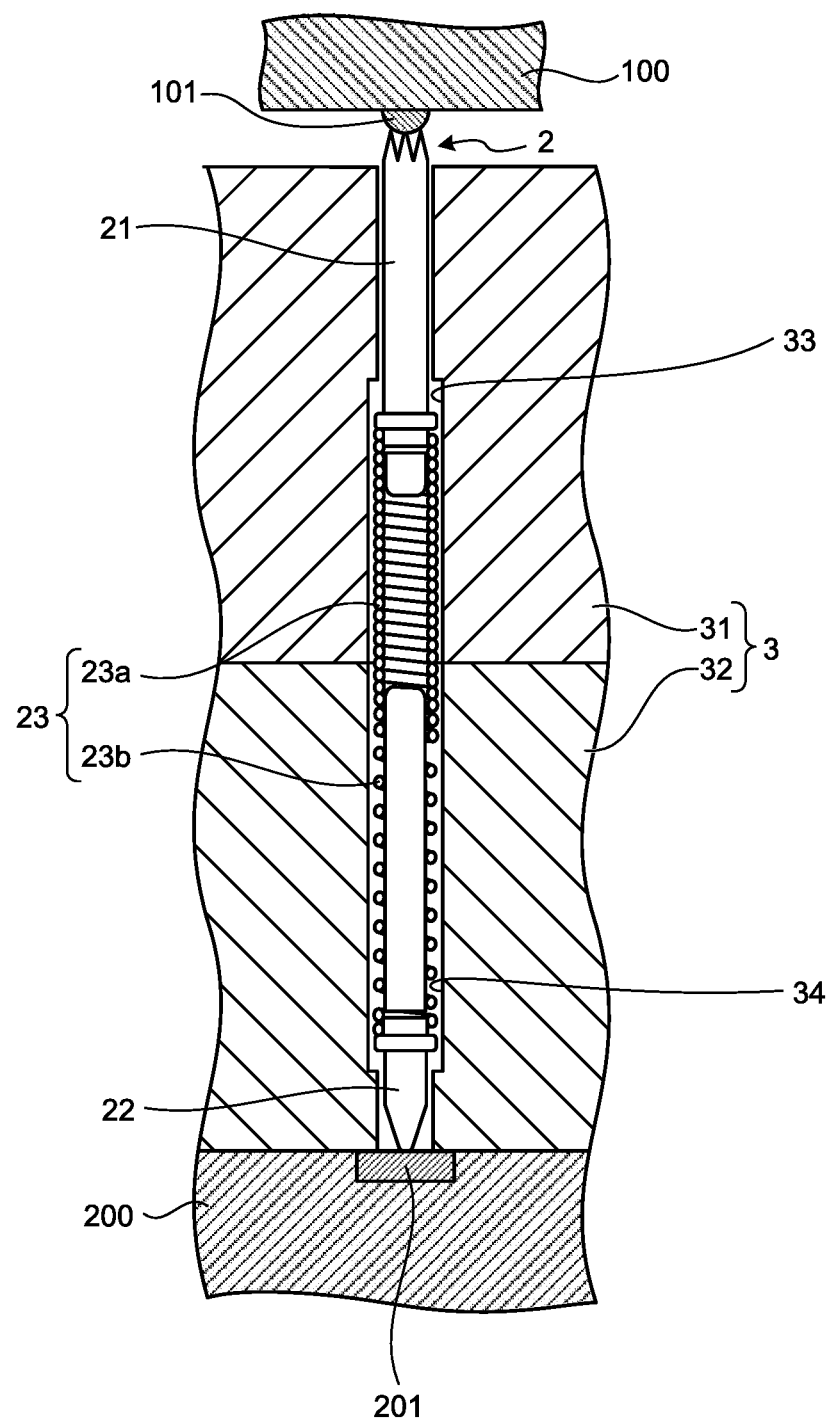
FIG. 3 is a partial sectional view of a configuration of the principal part of the socket while used in a test according to one example use of the alloy material of the embodiment of the present invention.

FIG. 3 is a partial sectional view of a configuration of the principal part of the socket (the contact probe) according to the one example use of the alloy material of the embodiment when testing the semiconductor integrated circuit and is a diagram illustrating a state when testing the semiconductor integrated circuit 100 using the probe holder 3. As illustrated in FIG. 3, when the coil spring 23 is compressed when testing the semiconductor integrated circuit 100, the base end 22d of the second plunger 22 is in sliding contact with the internal circumferential side of the tightly wound part 23a. In this process, the test signal supplied from the circuit board 200 to the semiconductor integrated circuit 100 reaches an electrode 101 for connection of the semiconductor integrated circuit 100 via the second plunger 22, the tightly wound part 23a, and the first plunger 21. In the probes 2, the first plunger 21 and the second plunger 22 are thus brought into conduction via the tightly wound part 23a, and a conduction path for an electric signal can be minimized. Consequently, a signal can be prevented from passing through the coarsely wound part 23b when testing, and inductance can be reduced and stabilized. Although the coil spring described in the present embodiment includes the coarsely wound part and the tightly wound part, a coil spring simply including the coarsely wound part alone may be used.

A distal end of the first plunger 21 is tapered, and even when an oxide film is formed on the surface of the electrode 101 for connection, the distal end of the first plunger 21 can break through the oxide film to be brought into direct contact with the electrode 101 for connection.

The configuration of the probes 2 described above is only by way of example, and the alloy material can be used for various kinds of known probes. The probes 2 may be, not limited to ones including the plungers and the coil spring as described above, a probe including a pipe member, Pogo pin, a wire probe obtaining a load by arcuately deflecting a wire, or a connection terminal (a connector) that connects electric contacts with each other, for example.

that, the resistance value of the produced test piece was measured to determine electric conductivity.

As to evaluation criteria for rolling workability, ones that were able to be worked without rupture were rated as A, whereas ones that were not able to be worked due to rupture were rated as B.

As to evaluation criteria for machinability, after being worked to a pin shape, ones that were within a working tolerance were rated as A, whereas ones that were outside the tolerance were rated as B.

The following describes the weight ratios of the respective metals of the alloy material according to the present examples. Table 1 lists the weight ratios (compositions) of the alloy materials according to Examples 1 to 15 and Comparative Examples 1 to 7 and measurement results.

TABLE 1

| | No. | Ag | Pd | Cu | Sn | Co | Cr | Zn | Ir | Ru | P | Aged material hardness [Hv] | Electric conductivity [(μΩ·m)⁻¹] | Rolling workability | Machinability |
|---|---|---|---|---|---|---|---|---|---|---|---|---|---|---|---|
| Examples | 1 | 23.00 | 46.00 | 30.39 | 0.50 | 0.10 | — | — | 0.01 | — | — | 511 | 8.50 | A | A |
| | 2 | 24.00 | 44.50 | 29.45 | 1.50 | 0.50 | — | — | 0.05 | — | — | 545 | 8.40 | A | A |
| | 3 | 21.50 | 39.00 | 38.49 | 2.00 | 1.00 | — | — | — | 0.01 | — | 482 | 8.71 | A | A |
| | 4 | 23.50 | 44.50 | 29.30 | 2.50 | — | 0.10 | — | — | 0.10 | — | 550 | 8.30 | A | A |
| | 5 | 20.00 | 53.50 | 24.45 | 1.50 | — | 0.50 | — | 0.03 | 0.02 | — | 515 | 8.13 | A | A |
| | 6 | 29.50 | 35.00 | 33.90 | 0.50 | — | 1.00 | — | 0.10 | — | — | 487 | 8.60 | A | A |
| | 7 | 28.00 | 50.50 | 20.35 | 1.00 | — | — | 0.10 | 0.05 | — | — | 490 | 8.10 | A | A |
| | 8 | 26.50 | 42.50 | 28.45 | 2.00 | — | — | 0.50 | — | 0.05 | — | 533 | 8.20 | A | A |
| | 9 | 24.00 | 45.00 | 29.49 | 0.50 | — | — | 1.00 | 0.01 | — | — | 520 | 8.25 | A | A |
| | 10 | 24.00 | 44.50 | 29.65 | 1.50 | 0.20 | 0.10 | — | — | 0.05 | — | 548 | 8.33 | A | A |
| | 11 | 22.00 | 46.00 | 30.95 | 0.50 | 0.30 | — | 0.20 | 0.05 | — | — | 530 | 8.20 | A | A |
| | 12 | 24.00 | 44.00 | 29.45 | 2.00 | — | 0.20 | 0.30 | 0.05 | — | — | 540 | 8.26 | A | A |
| | 13 | 27.50 | 42.50 | 26.40 | 2.50 | 0.30 | 0.30 | 0.40 | 0.05 | 0.05 | — | 535 | 8.50 | A | A |
| | 14 | 28.00 | 50.00 | 20.847 | 1.00 | — | — | 0.10 | 0.05 | — | 0.003 | 495 | 8.08 | A | A |
| | 15 | 24.00 | 44.50 | 29.62 | 1.50 | 0.20 | 0.10 | — | — | 0.05 | 0.03 | 558 | 8.25 | A | A |
| Comparative Examples | 1 | 24.50 | 45.50 | 30.00 | — | — | — | — | — | — | — | 456 | 9.86 | A | A |
| | 2 | 23.50 | 44.50 | 29.45 | 2.50 | — | — | — | 0.05 | — | — | 553 | 8.37 | A | B |
| | 3 | 24.00 | 44.00 | 28.55 | 3.00 | 0.20 | 0.20 | — | 0.05 | — | — | 558 | — | B | — |
| | 4 | 23.00 | 45.00 | 28.45 | 2.00 | 1.50 | — | — | — | 0.05 | — | 551 | — | B | — |
| | 5 | 26.00 | 44.50 | 26.45 | 1.50 | — | 1.50 | — | 0.05 | — | — | 553 | — | B | — |
| | 6 | 21.50 | 47.00 | 27.45 | 2.50 | — | — | 1.50 | — | 0.05 | — | 557 | — | B | — |
| | 7 | 24.00 | 44.50 | 29.00 | 2.00 | — | 0.20 | 0.20 | 0.05 | — | 0.05 | — | — | B | — |

The connection terminal connects the electric contacts with each other and include two conductive terminals to be in contact with the respective electric contacts and elastic members (or holding members) that slidably hold the respective terminals like the probes 2, for example. In such a connection terminal, at least the terminals are formed of the alloy material.

EXAMPLES

The following describes examples and comparative examples of the alloy material of the present invention in detail. The following first describes the details of measurement of the alloy material according to the present examples.

A hardness test piece was produced by performing solution treatment and aging treatment. After that, the Vickers hardness (the aged material hardness) of the produced test piece was measured.

A test piece for electric conductivity was produced by performing solution treatment and aging treatment. After Examples 1 to 13 have compositions containing a ternary alloy of Ag—Pd—Cu with weight ratios of 20 to 30 wt % (20.00 to 29.50 wt %) of Ag, 35 to 55 wt % (35.00 to 53.50 wt %) of Pd, and 20 to 40 wt % (20.35 to 38.49 wt %) of Cu as a base, added with Sn in the range of 0.5 to 2.5 wt %, further added with any one of or a combination of Co, Cr, and Zn in the range of 0.1 to 1.0 wt %, and added with 0.01 to 0.1 wt % of either one of or a combination of Ir and Ru. Examples 14 and 15 have the alloy compositions further added with 0.003 to 0.03 wt % of P.

Comparative Example 1 is a ternary alloy of Ag—Pd—Cu with weight ratios of 20 to 30 wt % of Ag, 35 to 55 wt % of Pd, and 20 to 40 wt % of Cu. Comparative Example 2 is a composition out of the present embodiment without Co, Cr, and Zn added. Comparative Examples 3 to 6 are compositions in which Sn, Co, Cr, and Zn are out of the composition range according to the present embodiment. Comparative Example 7 is a composition in which P is out of the composition range according to the present embodiment.

The following describes the measurement results of Examples 1 to 15 and Comparative Examples 1 to 7. Examples 1 to 13 are the compositions containing the ternary alloy of Ag—Pd—Cu with weight ratios of 20 to 30 wt % of Ag, 35 to 55 wt % of Pd, and 20 to 40 wt % of Cu as a base, added with Sn in the range of 0.5 to 2.5 wt %, further added with any one of or a combination of Co, Cr, and Zn in the range of 0.1 to 1.0 wt %, and added with 0.01 to 0.1 wt % of either one of or a combination of Ir and Ru. Examples 1 to 13 had a Vickers hardness after aging treatment of the range of 480 to 560 and were favorable in rolling workability and machinability. It has been revealed from these results that the addition of Sn, Co, Cr, Zn, Ir, and Ru contributes to improvement in Vickers hardness compared with Comparative Example 1 without Sn, Co, Cr, Zn, Ir, and Ru added.

Example 14 is the composition of Example 7 further added with 0.003 wt % of P, whereas Example 15 is a composition of Example 10 further added with 0.03 wt % of P. Compared with Examples 7 and 10, it has been revealed that the addition of P contributes to improvement in Vickers hardness. In Example 14, the content of Pd is reduced along with the addition of P. In Example 15, the content of Cu is reduced along with the addition of P.

In contrast, Comparative Example 2 is a composition with 2.5 wt % of Sn and 0.05 wt % of Ir added to the ternary alloy of Ag—Pd—Cu within the composition range according to the present embodiment. Although improvement in hardness was observed, machinability degraded compared with Examples 1 to 15 with Co, Cr, and Zn added. It has been revealed that the addition of Co, Cr, and Zn contributes to improvement in machinability.

Comparative Examples 3 to 6 are compositions with Sn, Co, Cr, and Zn added over the composition range according to the present embodiment. Although improvement in hardness was observed, rolling workability degraded compared with Examples 1 to 15.

Comparative Example 7 is a composition with P added over the composition range according to the present embodiment. Workability degraded compared with Examples 1 to 15.

In the measurement of electric conductivity, it has been revealed that Examples 1 to 15 are favorable in conductivity.

INDUSTRIAL APPLICABILITY

As described above, the alloy material and the contact probe and the connection terminal formed of the alloy material according to the present invention are useful for contact probe use in terms of conductivity, hardness, and workability.

REFERENCE SIGNS LIST

1 Socket
2 Contact probe (probe)
3 Probe holder
4 Holder
21 First plunger
22 Second plunger
23 Coil spring
23a Tightly wound part
23b Coarsely wound part
31 First member
32 Second member
33, 34 Holder hole
100 Semiconductor integrated circuit
101 Electrode for connection
200 Circuit board
201 Electrode

The invention claimed is:

1. An alloy material comprising:
   a composition, in a composition range of an alloy of silver (Ag), palladium (Pd), and copper (Cu), the composition containing 20 to 30 wt % of Ag, 35 to 55 wt % of Pd, and 20 to 40 wt % of Cu, wherein
   the composition as a base is
      added with tin (Sn) in a range of 0.5 to 2.5 wt %,
      added with chromium (Cr) in a range of 0.1 to 1.0 wt %, and
      added with 0.01 to 0.1 wt % of either one of or a combination of iridium (Ir) and ruthenium (Ru).

2. The alloy material according to claim 1, wherein 0.003 to 0.03 wt % of phosphorous (P) is further added.

3. The alloy material according to claim 2, wherein Vickers hardness of the alloy material subjected to aging treatment by heating is 480 to 560.

4. The alloy material according to claim 1, wherein Vickers hardness of the alloy material subjected to aging treatment by heating is 480 to 560.

5. The alloy material according to claim 1, wherein
   the composition is further added with 0.9 wt % or less of either one or a combination of cobalt (Co) and zinc (Zn), and
   a combination of chromium (Cr), cobalt (Co) and zinc (Zn) is 1.0 wt % or less.

6. The alloy material according to claim 1, wherein the composition is added with 0.01 to 0.1 wt % of iridium (Ir).

7. The alloy material according to claim 6, wherein
   the composition is further added with 0.09 wt % or less of ruthenium (Ru), and
   a combination of iridium (Ir) and ruthenium (Ru) is 0.1 Wt % or less.

8. A conductive connection terminal, wherein
   both ends of the conductive connection terminal in a longitudinal direction are configured to contact with respective contact objects, and
   at least a part of the conductive connection terminal is formed of the alloy material according to claim 1.

9. The conductive contact probe according to claim 8, wherein Vickers hardness of the alloy material subjected to aging treatment by heating is 480 to 560.

10. The conductive contact probe according to claim 8, wherein the composition is further added with 0.003 to 0.03 wt % of phosphorous (P).

11. The conductive contact probe according to claim 10, wherein Vickers hardness of the alloy material subjected to aging treatment by heating is 480 to 560.

12. A conductive contact probe, wherein
   both ends of the conductive contact probe in a longitudinal direction are configured to contact with respective contact objects, and
   at least a part of the conductive contact probe is formed of the alloy material according to claim 1.

13. The conductive contact probe according to claim 12, wherein the composition is further added with 0.003 to 0.03 wt % of phosphorous (P).

14. The conductive contact probe according to claim 13, wherein Vickers hardness of the alloy material subjected to aging treatment by heating is 480 to 560.

15. The contact probe according to claim 12, comprising:
   a conductive first plunger, one end of the conductive first plunger being configured to contact with one of the contact objects;

a conductive second plunger, one end of the conductive second plunger being configured to contact with another one of the contact objects; and a coil spring provided in between the first plunger and the second plunger to couple the first plunger and the second plunger in an expandable and contractible manner, wherein at least one of the first plunger, the second plunger and the coil spring is formed of the alloy material.

16. The conductive contact probe according to claim 15, wherein Vickers hardness of the alloy material subjected to aging treatment by heating is 480 to 560.

17. The conductive contact probe according to claim 15, wherein the composition is further added with 0.003 to 0.03 wt % of phosphorous (P).

18. The conductive contact probe according to claim 17, wherein Vickers hardness of the alloy material subjected to aging treatment by heating is 480 to 560.

19. The conductive contact probe according to claim 12, wherein Vickers hardness of the alloy material subjected to aging treatment by heating is 480 to 560.

* * * * *